(12) United States Patent
Takahashi

(10) Patent No.: US 6,222,780 B1
(45) Date of Patent: Apr. 24, 2001

(54) HIGH-SPEED SRAM HAVING A STABLE CELL RATIO

(75) Inventor: Hiroyuki Takahashi, Tokyo (JP)

(73) Assignee: NEC Corpoartion, Tokyo (JP)

( * ) Notice: Subject to any disclaimer, the term of this patent is extended or adjusted under 35 U.S.C. 154(b) by 0 days.

(21) Appl. No.: 09/521,965

(22) Filed: Mar. 9, 2000

(30) Foreign Application Priority Data

Mar. 10, 1999 (JP) .................................................. 11-062924

(51) Int. Cl.[7] .................................................. G11C 16/04
(52) U.S. Cl. ................ 365/189.09; 365/154; 365/230.06
(58) Field of Search .............................. 365/154, 189.09, 365/214, 226, 230.06

(56) References Cited

FOREIGN PATENT DOCUMENTS 6-104405   4/1994   (JP) .

Primary Examiner—Richard Elms
Assistant Examiner—VanThu Nguyen
(74) Attorney, Agent, or Firm—Young & Thompson

(57) ABSTRACT

A SRAM includes four-transistor memory cells each operating in a data hold mode using an off-leak current supplied from a digit line through a transfer transistor in an off-state. The cell ratio of the memory cell is determined by a reference voltage which has un-uniformity corresponding to un-uniformity of the cell ratio, thereby offering a stable data hold operation and a higher-speed equalization of digit lines.

9 Claims, 6 Drawing Sheets

HIGH-SPEED SRAM HAVING A STABLE CELL RATIO

BACKGROUND LINE OF THE INVENTION (a) Field of the Invention

The present invention relates to a high-speed SRAM (static random access memory) having a stable cell ratio and, more particularly, to an improvement of a SRAM having four-transistor memory cells in the operational speed and a data hold characteristic.

(b) Description of a Related Art

SRAMs have been used in the field where a high-speed operation is desired. SRAMs having four-transistor memory cells of a CMOS structure are used more or more due to its capability of higher-density integration and more stable operation compared to the conventional SRAM.

Patent Publication JP-A-6-104405 describes a SRAM having four-transistor memory cells of a CMOS structure, such as shown in FIG. 1. The memory cell includes a pair of transfer pMOS transistors 11 and 12, and a pair of driver nMOS transistors 13 and 14. An internal node P1 is connected through transfer pMOS transistor 11 to a digit line 15, through driver nMOS transistor 13 to the ground line, and directly to the gate of driver nMOS transistor 14. Another internal node P2 is connected through driver pMOS transistor 12 to another digit line 16, through driver nMOS transistor 14 to the ground line, and directly to the gate of driver nMOS transistor 13. The gates of pMOS transistors 11 and 12 are connected to a word line 17.

In a write operation, the potential of the word line 17 is lowered to a low level for turning on transfer pMOS transistors 11 and 12, and one of driver MOSFETs 13 and 14 is turned on and the other is turned off by a potential difference between digit lines 15 and 16.

In a read operation, the potential of the word line 17 is also lowered to a low level to cause the potential difference between digit lines 15 and 16 due to the potentials of internal nodes P1 and P2, which depend on the on- or off-state of driver nMOS transistors 13 and 14.

In a data-hold operation, the word line 17 is maintained at a high level to turn off transfer pMOS transistors 11 and 12, and digit lines 15 and 16 are applied with the VCC potential, whereby one of driver nMOS transistors 13 and 14 is turned on by the negative resistance of a corresponding driver nMOS transistor 13 or 14 passing a sub-threshold leak current.

In the conventional SRAM as described above, the pMOS structure of transfer transistors 11 and 12 allows one of the internal nodes P1 and P2 to assume a VCC potential level substantially without a voltage drop caused by the threshold voltage of the transistors after the Write operation. This in turn allows the memory cell to operate with a low voltage power source. In addition, since the transfer pMOS transistors acting as negative resistance elements in the data hold mode can be fabricated as TFTs above the driver nMOS transistors, a smaller occupied area can be obtained for the circuit pattern.

The conventional SRAM has the following problems however. First, it is difficult to select a suitable value for the cell ratio due to the un-uniformity of the resistance characteristics of MOSFETs which depend on the process conditions in the fabrication process thereof. The term "cell ratio" as used herein means the ratio of the off-resistance of the transfer pMOS transistors to the off-resistance of the driver nMOS transistors. The cell ratio determines the off-leak current of the transfer pMOS transistors which allows the driver nMOS transistors to hold the memory in a data hold mode, and also determines the on-current of the driver pMOS transistors so that the source-drain voltage drop of the driver pMOS transistor is equal to or below 0.3 volt in a read mode.

Second, during the write operation wherein the internal node P1 or P2 is lowered from the VCC level to the ground level by the digit lines 15 or 16 through the transfer pMOS transistors, the transfer pMOS transistors have a higher on-resistance in the vicinity of 1 volt for the gate voltage thereof, or around the threshold voltage. The higher on-resistance reduces the operational speed of the SRAM in the write operation.

Third, there is a large recovery time after the end of the write operation for the digit lines to prepare the start of the next read cycle by raising the potential of the digit lines up to the VCC level. In this situation, since the pMOSFET has lower current driveability compared to the nMOSFET, the dimensions of the pMOSFET should be increased in order to reduce the recovery time length. However, the larger dimensions of the pMOSFET with respect to the nMOSFET, that is, the smaller dimensions of nMOSFET with respect to the pMOSFET, results in a smaller occupied area for the memory cell, and thus reduces the distance between the digit lines, thereby raising the capacitance between the digit lines and impairing a high-speed operation of the SRAM.

SUMMARY OF THE INVENTION

In view of the above, it is an object of the present invention to provide a SRAM having a stable cell ratio and operating at a higher-speed by compensating the variations or un-uniformity of the cell ratio due to the process conditions in the fabrication process for the SRAM.

The present invention provides a SRAM including a plurality of memory cells arranged in a matrix and each including a pair of transfer transistors and a pair of driver transistors operatively connected for storing a cell data on a pair of internal nodes, a word line disposed for each row of the memory cells for driving gates of the transfer transistors of the memory cells in the each row, a pair of digit lines disposed for each column of the memory cells for transferring data through the transfer transistors of the memory cells in the each column, a word line driver disposed for each word line for activating the each word line, one of the driver nMOS transistors passing an off-leak current supplied from a corresponding one of the digit lines through a corresponding one of the transfer transistors in an off-state thereof to store the cell data, a precharge section for connecting the digit lines to a first source line for precharging, a write amplifier and a sense amplifier disposed for each column of the memory cells for storing/readifig data through the digit lines into/from the memory cells in the each column, and a reference voltage generator for generating a reference voltage which determines a cell ratio of each memory cell, the reference voltage having un-uniformity corresponding to un-uniformity of a potential of one of the internal nodes assuming a high level or low level.

In accordance with the SRAM of the present invention, a stable and optimum cell ratio can be obtained by the reference voltage, which cancels unstable hold operation caused by the un-uniformity of the cell ratio due to the process conditions by using un-uniformity of the reference voltage which determines the cell ratio.

The above and other objects, features and advantages of the present invention will be more apparent from the following description, referring to the accompanying drawings.

PREFERRED EMBODIMENTS OF THE INVENTION

Figure 1:
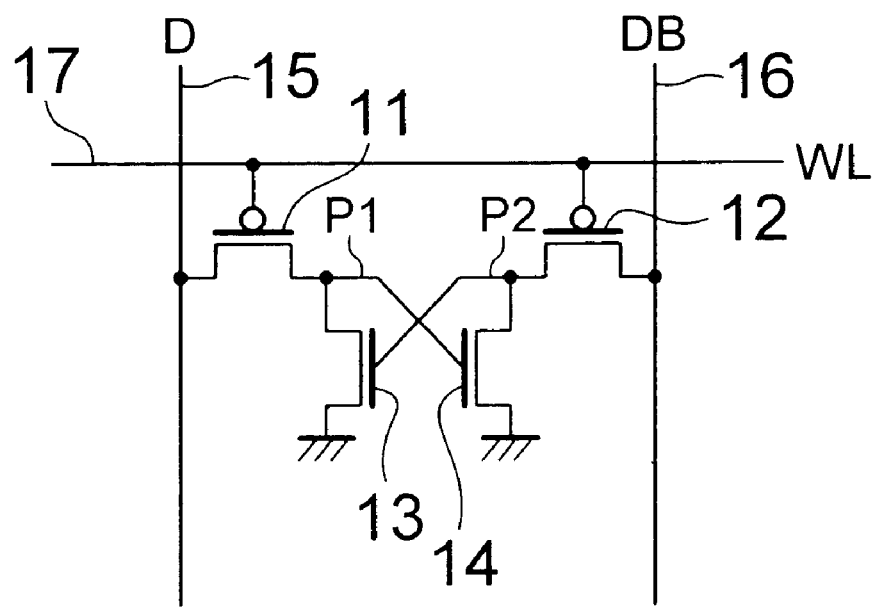
FIG. 1 is a circuit diagram of a memory cell of a typical SRAM having four-transistor memory cells.

Now, the present invention is more specifically described with reference to accompanying drawings, wherein similar constituent elements are designated by similar or a related reference numerals.

Figure 2:
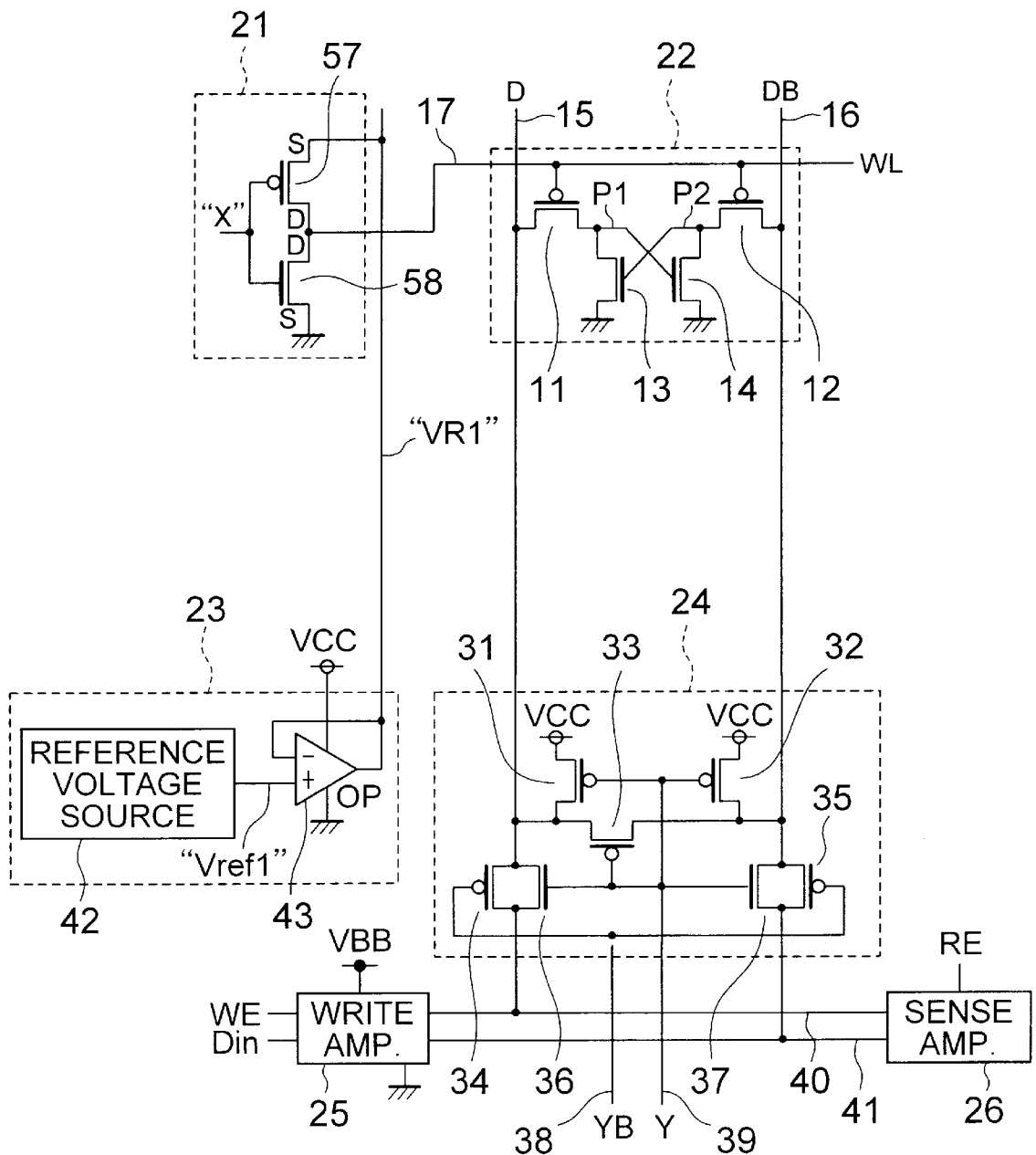
FIG. 2 is a circuit diagram of a principal part of a SRAM according to a first embodiment of the present invention.

Referring to FIG. 2, a SRAM according to a first embodiment of the present invention includes a plurality of memory cells 22 arranged in a matrix, a pair of digit lines 15 and 16 disposed for a corresponding column of the memory cells 22, and a word line 17 disposed for a corresponding row of the memory cells 22.

The SRAM further includes a word line driver 21 disposed for a corresponding word line 17, a digit line driver 24 for driving a corresponding pair of digit lines 15 and 16, a write amplifier 25 and a sense amplifier 26 disposed for a corresponding pair of digit lines 15 and 16, and a reference voltage generator 23 for providing a reference voltage VR1 to the word line drivers 21.

The memory cell 22 has a configuration similar to the configuration of the memory cell shown in FIG. 1, and each element in the memory cell is designated by a similar reference numeral.

The word line driver 21 is implemented by an inverter including a pMOS transistor 57 and an nMOS transistor 58 connected in series between the output node of the reference voltage generator 23, or a reference voltage line, and the ground line. The gate of both transistors 57 and 58 are supplied with a word line control signal "X", and the output node of the word line driver 21 is connected to a corresponding word line 17. In this configuration, the word line driver 21 responds to a corresponding address signal to select the corresponding word line 17 by a low level.

In a write operation, the memory cell 22 is selected by a low level of the word line 17, which turns on the transfer pMOS transistors 11 and 12 to connect digit lines 15 and 16 to internal nodes P1 and P2, respectively. Thus, one of driver nMOS transistors 13 and 14 is turned on whereas the other of driver nMOS transistors 13 and 14 is turned off, which state corresponds to the write data supplied through digit lines 15 and 16. When the memory cell 22 is not selected, transfer pMOS transistors 11 and 12 are turned off, whereby transfer pMOS transistors 11 and 12 allow an off-leak current to flow therethrough to maintain the on- or off-state of driver nMOS transistors 13 and 14.

The digit line driver 24 includes a precharge section implemented by pMOS transistors 31 to 33, a pair of transfer gates controlled by a complementary digit line control signal "Y" and "YB" supplied through control signal lines 38 and 39. The pMOS transistors 31 and 32 couple VCC source line to digit lines 15 and 16, respectively. The pMOS transistor 33 couples digit lines 15 and 16 together for equalizing the potentials thereof. The transfer gates each including a pMOS transistor 34 or 35 and an nMOS transistor 36 or 37 couple digit lines 15 and 16 to data lines 40 and 41, respectively, the potentials of which are detected by a sense amplifier 26.

The digit line driver 24 shifts into a write or read mode when the digit line control signal "Y" assumes a high level, and into a precharge mode when the digit line control signal "Y" assumes a low level. In the write or read mode, pMOS transistors 31 to 33 are turned off, whereas pMOS transistors 34 and 35 and nMOS transistors 36 and 37 are turned on, whereby digit lines 15 and 16 are coupled to data lines 40 and 41, respectively. In a precharge mode, pMOS transistors 31 to 33 are turned on, whereas pMOSFETs 34 and 35 and nMOS transistors 36 and 37 are turned off, whereby digit lines 15 and 16 are coupled to VCC source line.

The reference voltage generator 23 includes a reference voltage source 42 for generating a primary reference voltage Vref1 and a voltage follower implemented by an operational amplifier 43. The operational amplifier 43 outputs the reference voltage VR1 which follows the primary reference voltage Vref1 supplied from the reference voltage source 42.

Figure 3:
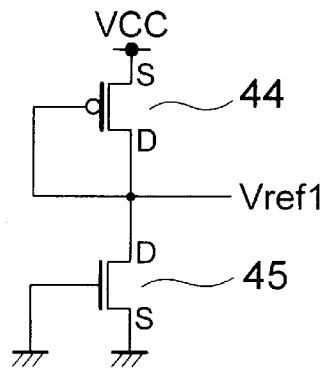
FIG. 3 is a circuit diagram of the reference voltage source shown in FIG. 2.

Referring to FIG. 3, the reference voltage source 42 includes a pMOS transistor 44 having transistor characteristics (dimensions) similar to those of transfer pMOS transistors 11 and 12, and an nMOS transistor 44 having transistor characteristics (dimensions) similar to is those of driver nMOS transistors 13 and 14, which are connected in series between VCC source line and the ground line. The gates of pMOSFET 44 and nMOSFET 45 are connected to drain and source of respective transistors 44 and 45. In this configuration, the primary reference voltage Vref1 supplied from the reference voltage source 42 is determined by the ratio between the off-resistances of pMOS transistor 44 and nMOS transistor 45, which ratio corresponds to the cell ratio between the transfer transistor and the driver transistor.

Figure 4:
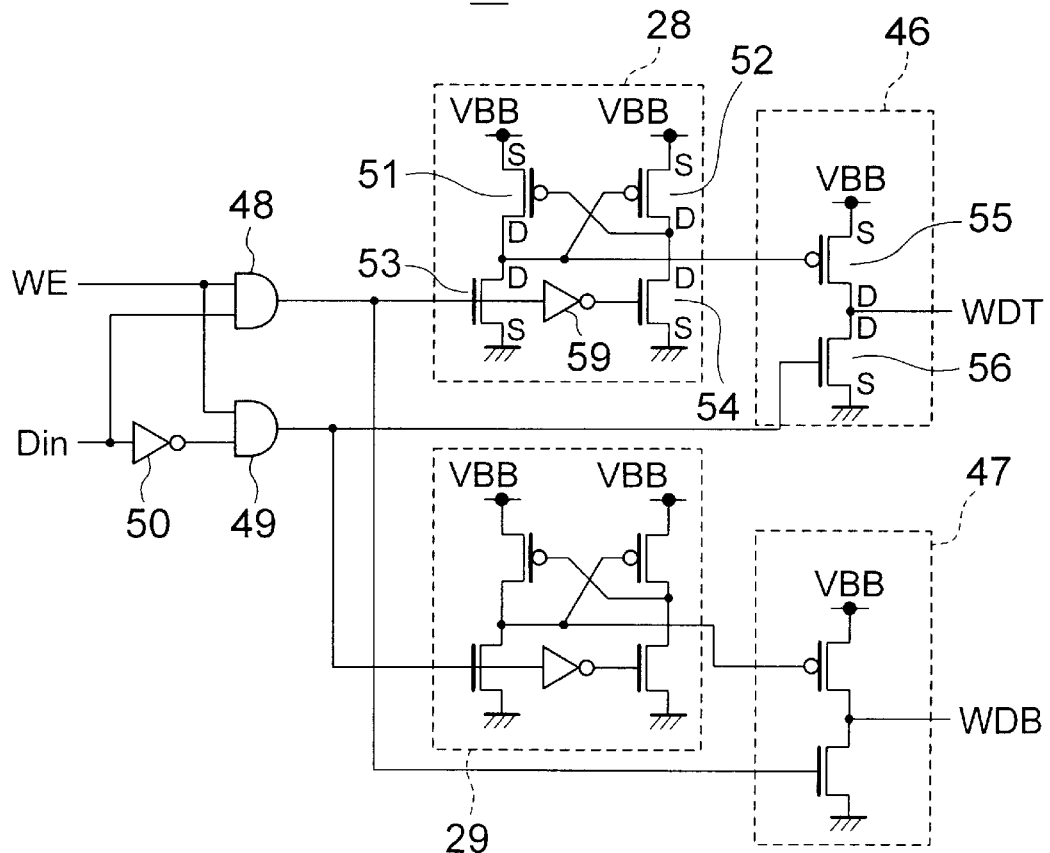
FIG. 4 is a circuit diagram of the write amplifier shown in FIG. 2.

Referring to FIG. 4, the write amplifier 25 includes a pair of level shift inverters 28 and 29, a pair of data line drivers 46 and 47, a pair of AND gates 48 and 49, and an inverter 50. AND gate 48 receives write enable signal WE and write data Din to deliver the write data Din to the write amplifiers 28 and 29 during a write mode, whereas AND gate 49 receives write enable signal WE and inverted write data through inverter 50 to deliver the inverted write data to the data line driver 46 and 47 during the write mode.

Each level shift inverter 28 or 29 includes a pair of pMOS transistors 51 and 52, a pair nMOS transistors 53 and 54 and an inverter 59. In each of the level shift inverters 28 and 29, pMOS transistor 51 and nMOS transistor 53 are connected in series between VBB source line and the ground line, whereas pMOS transistor 52 and nMOS transistor 54 are connected in series between VBB source line and the ground line. VBB source line has a potential level higher than the potential level of VCC source line. The gates of pMOS transistors 51 and 52 are connected to the drain of pMOS transistors 52 and 51, respectively. The gate of nMOS transistor 53 receives the write data, whereas the gate of nMOS transistor 54 receives inverted write data through inverter 59.

The level shift inverters 28 and 29 have a function for converting the potential level of the write data Din and the inverted write data into a higher potential level while inverting the polarity thereof. Each of the data line drivers 46 and 47 includes a pMOS transistor 55 and an nMOS transistor 56 connected in series between VBB source line and the ground line. The data line drivers 46 and 47 have a function for inverting the polarity of the write data to deliver a high- or low-level data and also assuming a high-impedance state or a floating level at the output thereof.

The write amplifier 25 outputs a higher potential level from VBB source line for the output signal thereof to the data lines 40 and 41 compared to the VCC level, whereby the potential difference between digit lines 15 and 16 and thus the potential difference between internal nodes P1 and P2 can be increased compared to the conventional SRAM.

Figure 5:
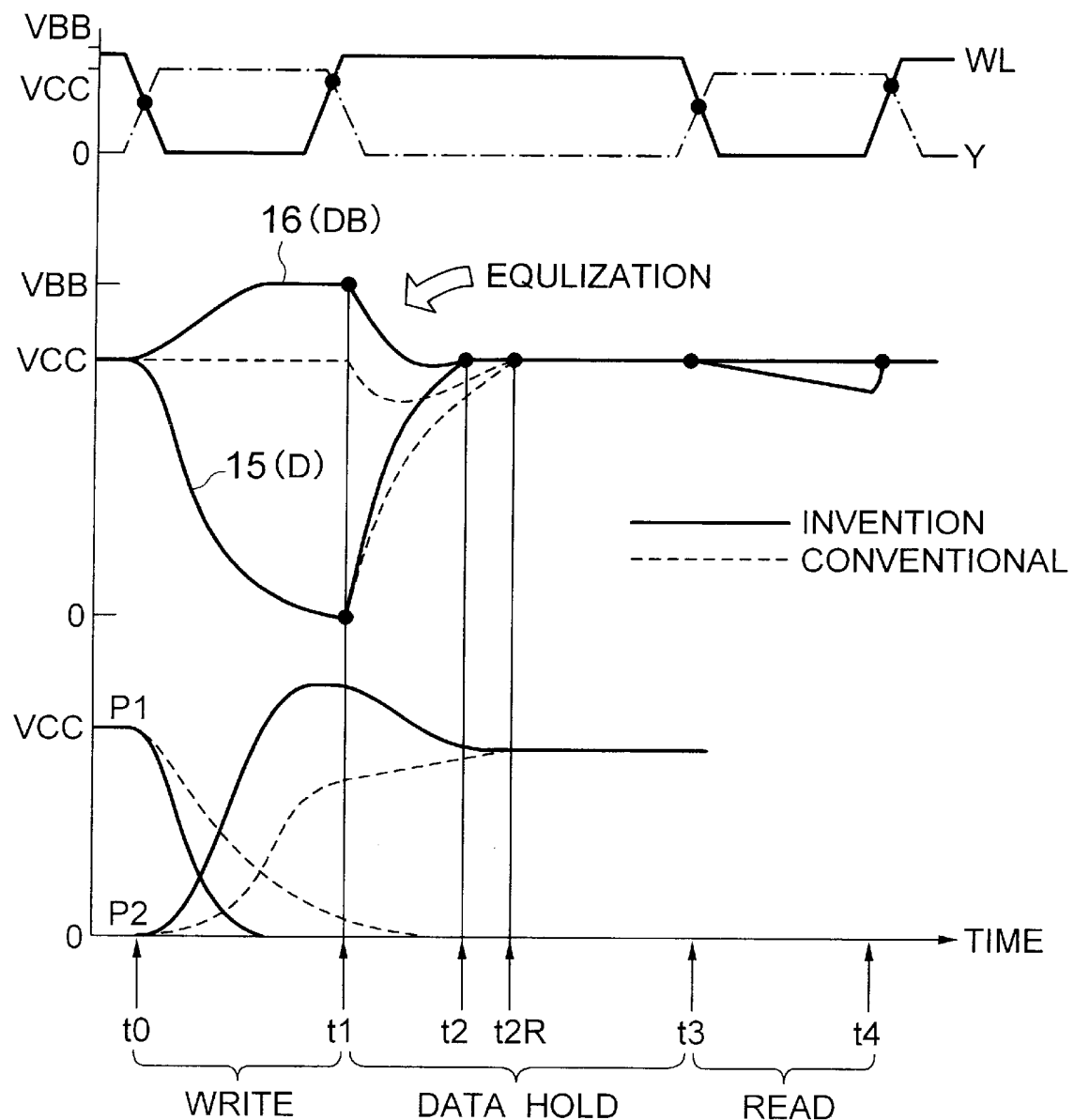
FIG. 5 is a signal timing chart for comparing the embodiment against a conventional SRAM.

Referring to FIG. 5, write, data hold and read operations of the SRAM of FIG. 2 is depicted in solid lines in comparison with operations of the conventional SRAM which are depicted in dotted lines. In a write operation which is effected between time instants t0 and t1, word line control signal "X", digit line control signal "Y" and write enable signal "WE" are maintained at a high level, whereas read enable signal "RE" is maintained at a low level. It is depicted in FIG. 5 that the potentials of internal nodes P1 and P2 are made reversed during the write operation in the memory cell 22. The write amplifier 25 using a higher potential level of VBB source line compared to VCC level allows internal nodes P1 and P2 to fall and rise, respectively, at a higher speed in the write operation.

In a data-hold operation, which is effected between t1 and t3, word line control signal "X", write enable signal WE, and read enable signal RE are maintained at a low level, whereas digit line control signal "Y" is maintained at a high level. The digit line driver 24 couples digit lines 15 and 16 to VCC source line, and the word line driver 21 raises the potential of the word line 17 to a reference voltage level VR1.

For maintaining internal node P2 at a high level with stability, the off-resistance of transfer pMOS transistor 12 may be reduced significantly to increase the off-leak current of transfer pMOS transistor 12 up to a level one or two orders higher than the off-leak current of driver nMOS transistors 13 and 14. In this case, however, the current flowing through transfer pMOS transistor 11 to internal node P1 assuming a low level is increased as well, which raises power dissipation of the SRAM and is undesirable.

Thus, it is important to select the cell ratio at an optimum value for a stable data hold operation. In the reference voltage source 42, although nMOS transistor 45 and pMOS transistor 44 are turned off when the output node assumes a high level, an off-leak current flows through pMOS transistor 44 and nMOS transistor 45. The off-leak current provides a potential for the primary reference voltage Vref1, which is substantially equal to the potential of internal node P2 obtained by the off-leak current flowing in the memory cell 22 in the data hold mode. That is, the word driver 21 disposed for the word line 17 connected to the memory cell 22 in a hold mode delivers the primary reference potential Vref1 to the word line 17, and to the gate of transfer transistors 11 and 12. This means that a current mirror arrangement is obtained wherein pMOS transistor 44 in the reference voltage source 42 constitutes a reference side and pMOS transistors 11 and 12 in the memory cell 22 constitute output sides.

The current mirror configuration allows driver transistors 13 or 14 to pass a current which remains at a constant ratio with respect to the off-leak current flowing through nMOS transistor 45 in the reference voltage source 42. Although the reference voltage generator 23 generally involves an error (or un-uniformity) in the ratio of the off-resistance of pMOS transistor 44 to the off-resistance of nMOS transistor 45 in the reference voltage source 42 caused by a fabrication process, the error corresponds to the error of the cell ratio generated in the memory cell 22 by the fabrication process. Thus, the error or un-uniformity in the reference voltage generator 23 cancels the error or un-uniformity of the cell ratio by adjusting the reference voltage VR1 so that off-resistance of transfer pMOS transistors 11 and 12 stay at an optimum value.

For the potential equalization of digit lines 15 and 16 effected between time instants t1 and t2 just after a write operation, the digit line driver 24 couples digit lines 15 and 16 to VCC source line at t1 for precharging. Digit line 16 assuming a VBB level at t1 is lowered due to the function of digit line 15 which acts as a load, in addition to the affection of the source impedance. This raises the potential of digit line 15 toward the VCC level. If digit line 16 stays at a VCC level at time t1, as in the case of the conventional device shown by the dotted line, the potential of digit line 16 may be lowered below the VCC level between t1 and t2, which delays digit lines 15 and 15 to assume the VCC level.

In the present embodiment, the higher VBB level of digit line 16 as well as the on-states of pMOS transistors 31 to 33 lowering the source impedance of VCC source line accelerates the digit lines 15 and 16 to assume the VCC level at t2, as shown in FIG. 5, compared to t2R for the conventional SRAM.

In a read operation, effected between t3 and t4, word line control signal "X", digit line control signal "Y" and read enable signal RE are raised to a high level, whereas write enable signal WE is lowered to a low level. The sense amplifier 26 detects the potential difference between data lines 40 and 41 to read out the data stored in the memory cell 22.

It may be considered that internal node P1 assuming a low level at t1 is raised up to a potential level to cause destruction of the data stored in the memory cell 22 due to digit line 15 being precharged to a VCC level. The destruction can be avoided, without using the configuration of the present embodiment, by a lower on-resistance of transfer pMOS transistor 11, which, however, delays the rise of potential difference between digit lines 15 and 16 during the read operation. The optimum cell ratio in the present embodiment does not involve such a defect, and is suitable for avoiding the defect.

In short, the present embodiment offers advantages of higher-speed write operation and recovery operation as well as a stable hold operation in the memory cell.

Figure 6:
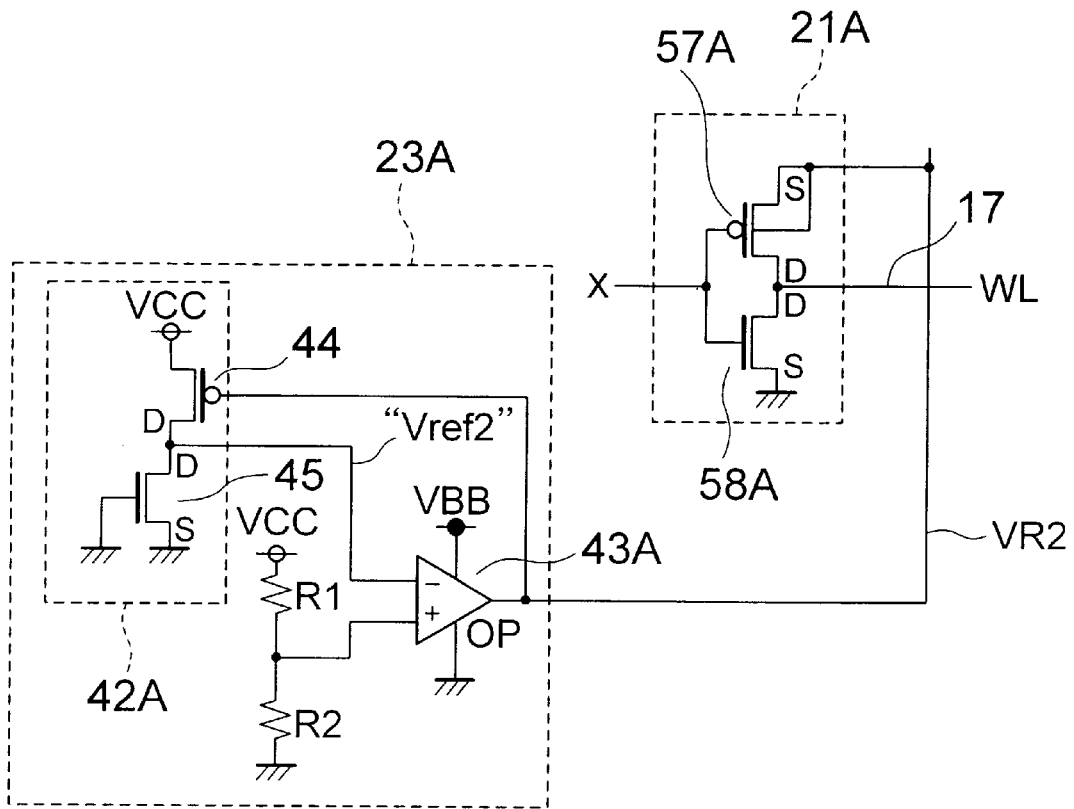
FIG. 6 is a circuit diagram of a principal part of a SRAM according to a second embodiment of the present invention.

Referring to FIG. 6, a SRAM according to a second embodiment of the present invention has a configuration similar to that of the first embodiment except for the word line driver 21A and the reference voltage generator 23A, which can expand the variable voltage range of gates of transfer pMOS transistors 11 and 12.

The word line driver 21A includes a pMOS transistor 57A and an nMOS transistor 58A connected in series between the reference voltage line and the ground line. Both the gates of pMOS transistor 57A and nMOS transistor 58A are fed with word line control signal "X", and the common drains thereof are connected to a corresponding word line 17. The n-well receiving therein pMOS transistor 57A is connected to the source of pMOS transistor 57A.

The common potential of the source and n-well of pMOS transistor 57A electrically separates the p-n junction formed therebetween, thereby allowing the reference voltage VR2 to rise up to the VBB level.

The reference voltage generator 23A includes a reference voltage source 42A including a pMOS transistor 44 and an nMOS transistor 45 connected in series between VCC source line and the ground line to deliver an output from the common drains thereof, an operational amplifier 43A having a non-inverting input for receiving a constant voltage generated by a voltage divider (including resistors R1 and R2) and an inverting input for receiving a primary reference voltage Vref1 output from the reference voltage source 42A to deliver the reference voltage VR2. The reference voltage VR2 is fed back to the gate of pMOS transistor 44.

The reference voltage source 42A has a ratio of the off-resistance of pMOS transistor 44 to the off-resistance of nMOS transistor 45, which ratio is equal to the cell ratio of the memory cell 22 which stays in a data hold mode for a high level of internal node P2. The primary reference voltage Vref2 is equal to the potential at internal node P2.

In the present embodiment, the reference voltage VR2 has a wide variable range, which improves canceling of the error in the cell ratio.

Figure 7:
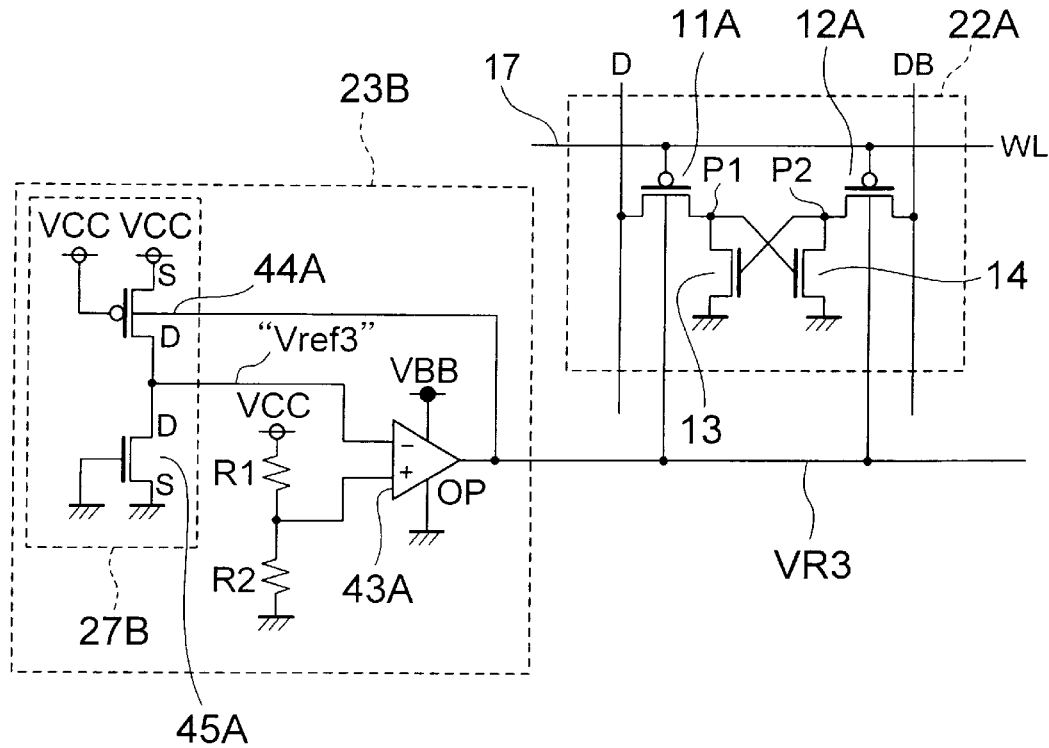
FIG. 7 is a circuit diagram of a principal part of a SRAM according to a third embodiment of the present invention.

Referring to FIG. 7, a SRAM according to a third embodiment of the present invention is similar to the first embodiment except that transfer pMOS transistors 11A and 12A in the memory cell 22A receives the reference voltage VR3 at the n-well thereof from the reference voltage generator 23B. The gages of pMOS transistors 11A and 12A are connected to a word line 17.

Reference voltage generator 23B is similar to the reference voltage generator 23A shown in FIG. 6 except that the gate of pMOS transistor 44A is connected to the VCC source line, and the n-well for pMOS transistor 44A is connected to the output node of the operational amplifier 43A for receiving the reference voltage VR3.

The higher potential of the n-well for pMOS transistor 44A raises the on-resistance of pMOS transistor 44A similarly to the higher gate potential thereof. The reference voltage generator 23B adjusts the potential of n-well for pMOS transistor 44A to obtain an optimum cell ratio similarly to the second embodiment.

According to the third embodiment, VCC source line can be used for the source line of the word line driver, which suppresses an increase of the occupied area for the power source lines and timing fluctuation on the word line.

Figure 8:
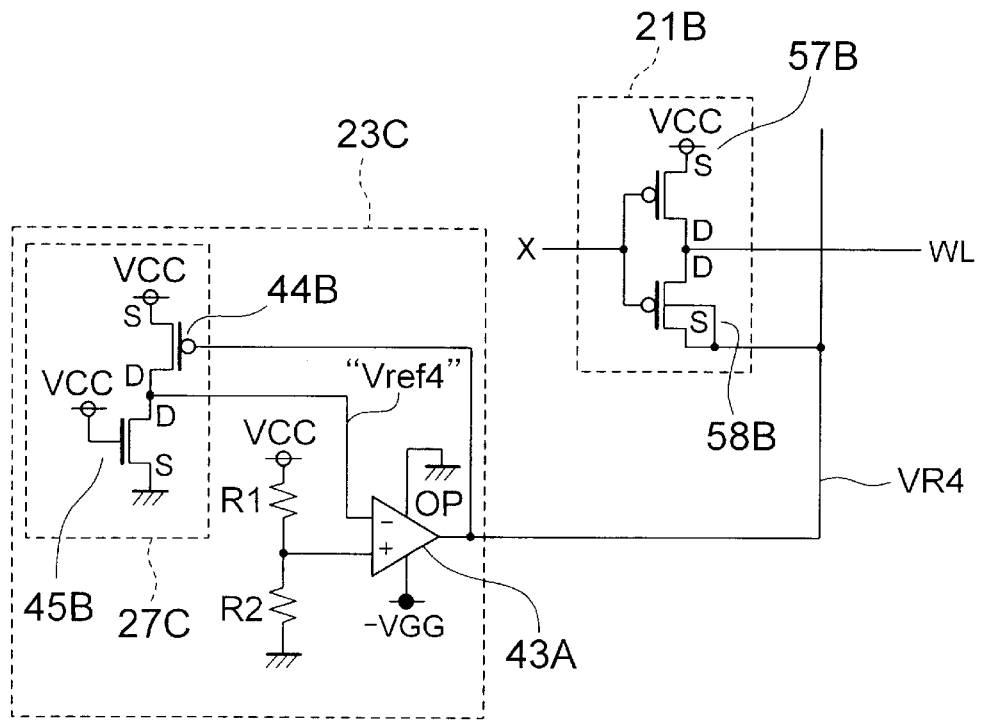
FIG. 8 is a circuit diagram of a principal part of a SRAM according to a fourth embodiment of the present invention.

Referring to FIG. 8, a SRAM according to a fourth embodiment of the present invention is similar to the second embodiment except that the reference voltage generator 23C in the present embodiment provides the reference potential level VR4 on the low voltage line of the word line driver 21B.

More specifically, the p-well of nMOS transistor 58B in the word line driver 21B is connected to the reference voltage line instead of the n-well of pMOS transistor 56 in the second embodiment. The gate of nMOS transistor 45B in the reference voltage source 23C is connected to VCC source line instead of the ground line.

In this configuration, the ratio of off-resistance of pMOS transistor 44B to the off-resistance of nMOS transistor 45B is equal to the cell ratio of memory cell 22A which operates in a read mode for a high level of internal node P2, whereby the primary reference voltage Vref4 is equal to the potential of internal node P2 of such memory cell. The reference voltage generator 23C adjusts the low voltage level of the word line driver 21B to obtain an optimum level for the cell ratio of the memory cell 22.

According to the fourth embodiment, since the reference voltage generator 23C offers an optimum level for the cell ratio in the memory cell operating in a read mode, the process conditions for fabrication of the SRAM are selected to obtain an optimum value for cell ratio of the memory cell in a data hold operation.

In the above embodiments, when the memory cell shifts from a write mode to a data hold mode, the control is such that the memory cell is released from the selection thereof before the digit lines 15 and 16 are isolated from the data lines 40 and 41. This control offers further reduction of the affection to the memory cell by the equalization operation, which is desirable.

Since the above embodiments are described only for examples, the present invention is not limited to the above embodiments and various modifications or alterations can be easily made therefrom by those skilled in the art without departing from the scope of the present invention.

What is claimed is:

1. A SRAM comprising a plurality of memory cells arranged in a matrix and each including a pair of transfer transistors and a pair of driver transistors operatively connected for storing a cell data on a pair of internal nodes, a word line disposed for each row of said memory cells for driving gates of said transfer transistors of said memory cells in the each row, a pair of digit lines disposed for each column of said memory cells for transferring data through said transfer transistors of said memory cells in the each column, a word line driver disposed for each word line for activating the each word line, one of said driver transistors passing an off-leak current supplied from a corresponding one of said digit lines through a corresponding one of said transfer transistors in an off-state thereof to store the cell data, a precharge section for connecting said digit lines to a first source line for precharging, a write amplifier and a sense amplifier disposed for each column of said memory cells for storing/reading data through said digit lines into/from said memory cells in the each column, and a reference voltage generator for generating a reference voltage which determines a cell ratio of each memory cell, the reference voltage having un-uniformity corresponding to un-uniformity of a potential of one of said internal nodes assuming a high level or low level.

2. The SRAM as defined in claim 1, wherein said transfer transistors are of pMOS type and said driver transistors are of nMOS type.

3. The SRAM as defined in claim 2, wherein said reference voltage generator includes a pMOS transistor and an nMOS transistor connected in series between said first source line and a ground line, and a voltage follower having an input connected to a node connecting said pMOS transistor and said nMOS transistor and an output for outputting the reference voltage.

4. The SRAM as defined in claim 2, wherein said reference voltage generator and a part of said memory cell form a current mirror.

5. The SRAM as defined in claim 4, wherein said write amplifier delivers a write signal having a potential higher than a potential of said first source line.

6. The SRAM as defined in claim 1, wherein said reference voltage determines a higher voltage level for a driving signal supplied from said word line driver.

7. The SRAM as defined in claim 1, wherein said reference voltage determines a lower voltage level for a driving signal supplied from said word line driver.

8. The SRAM as defined in claim 1, wherein said reference voltage determines a potential of an n-well of said transfer transistors.

9. The SRAM as defined in claim 1, wherein said reference voltage generator includes a pMOS transistor and an nMOS transistor connected in series between said first source line and the ground line, and an operational amplifier having a first input connected to a node connecting said pMOS transistor and said nMOS transistor, a second input connected to a constant potential line and an output connected to an n-well of said pMOS transistor and delivering the reference voltage.

* * * * *